United States Patent
Park et al.

(10) Patent No.: US 7,524,567 B2
(45) Date of Patent: *Apr. 28, 2009

(54) SPIROFLUORENE-BASED POLYMER AND ORGANIC ELECTROLUMINESCENT DEVICE USING THE SAME

(75) Inventors: Sang-Hoon Park, Seongnam-si (KR); Tae-Yong Noh, Gunpo-si (KR); Sang-Yeol Kim, Gwacheon-si (KR); Lyong-Sun Pu, Suwon-si (KR); Soo-Hyoung Lee, Suwon-si (KR); In-Nam Kang, Suwon-si (KR); Jhun-Mo Son, Yongin-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 626 days.

This patent is subject to a terminal disclaimer.

(21) Appl. No.: 11/041,871

(22) Filed: Jan. 25, 2005

(65) Prior Publication Data
US 2005/0164034 A1  Jul. 28, 2005

(30) Foreign Application Priority Data
Jan. 27, 2004  (KR) .................. 10-2004-0004986

(51) Int. Cl.
*C09K 11/06* (2006.01)
*H01L 51/54* (2006.01)
*H05B 33/14* (2006.01)
*C08G 79/08* (2006.01)
*C08G 73/24* (2006.01)

(52) U.S. Cl. .............. 428/690; 428/917; 313/504; 313/506; 257/40; 257/E51.027; 257/E51.032; 257/E51.036; 528/8; 528/401

(58) Field of Classification Search .............. None
See application file for complete search history.

(56) References Cited

U.S. PATENT DOCUMENTS

| 5,708,130 | A | 1/1998 | Woo et al. | |
| 6,169,163 | B1 | 1/2001 | Woo et al. | |
| 6,495,273 | B1 * | 12/2002 | Hwang et al. | ............... 428/690 |
| 6,933,063 | B2 * | 8/2005 | Lee et al. | ............... 428/690 |
| 6,984,461 | B2 * | 1/2006 | Son et al. | ............... 428/690 |
| 2007/0102696 | A1 * | 5/2007 | Brown et al. | ............... 257/40 |

FOREIGN PATENT DOCUMENTS

WO  WO 01/81294  * 11/2001

OTHER PUBLICATIONS

Machine Translation, JP 2004-137456, Son et al. with english abstract.*

(Continued)

*Primary Examiner*—D. Lawrence Tarazano
*Assistant Examiner*—Brett A Crouse
(74) *Attorney, Agent, or Firm*—Robert E. Bushnell, Esq.

(57) ABSTRACT

A spirofluorene-based polymer which contains a spirofluorene structure as a basic unit and which is end-capped with functional moieties substituted by fluorine, and an organic electroluminescent device using an organic layer using the spirofluorene-based polymer. The organic electroluminescent device has improved efficiency, reduced driving voltage, and excellent thermal, optical and electrical stability.

20 Claims, 1 Drawing Sheet

OTHER PUBLICATIONS

Jeong-Ik Lee, et al., "Oxidative Stability and Its Effect on the Photoluminescence of Poly(Fluorence) Derivatives: End Group Effects," *Chem. Mater.*, Mar. 31, 1999, 11, p. 1083-1088.

Tzenka Miteva, et al., "Improving the Performance of Polyfluorene-based Organic Light-Emitting Diodes via End-Capping," *Adv. Mater.*, Apr. 18, 2001, 13, No. 8, p. 565-570.

* cited by examiner

SPIROFLUORENE-BASED POLYMER AND ORGANIC ELECTROLUMINESCENT DEVICE USING THE SAME

CLAIM OF PRIORITY

This application claims the benefit of Korean Patent Application No. 2004-4986, filed on Jan. 27, 2004, in the Korean Intellectual Property Office, the disclosure of which is incorporated herein in its entirety by reference.

BACKGROUND OF THE INVENTION

1. Field of the Invention

The present invention relates to a spirofluorene-based polymer and an organic electroluminescent device using the same, and more particularly to a spirofluorene-based polymer containing a spirofluorene structure as a basic unit, which has a high charge transport capability and blue light-emitting property, and has thermal, optical and electrical stability due to introduced functional moieties substituted by fluorine having an electrical property into the ends of the polymer, and an organic electroluminescent device using an organic layer containing the spirofluorene-based polymer. The device has improved efficiency and color purity and reduced driving voltage.

2. Description of the Related Art

Organic electroluminescent display devices can use either small molecular weight compounds or polymer compounds, depending on their composition and manufacture. In the preparation of a device using small molecular weight compounds, a thin film is formed by a vacuum deposition. This has the advantages of easy purification and high purity of the luminescent materials, and easy embodiment of color pixels. However, for practical applications, there are needs for enhancement in quantum efficiency, prevention of crystallization of thin films, and enhancement in color purity.

Many studies have been made into using polymers, since the discovery of the electroluminescence of poly(1,4-phenylenevinylene)(PPV) which is a π-conjugated polymer. π-conjugated polymers have an alternating chemical structure of single bonds (or σ bonds) and double bonds (or π bonds), so that the polymers have delocalized π electrons capable of freely moving along with the polymer chain. The π-conjugated polymers have semi-conductive properties, and thus the whole visible light region corresponding to the highest occupied molecular orbitals-lowest occupied molecular orbitals (HOMO-LUMO) energy band-gap of polymers can be easily obtained through molecular design of the π-conjugated polymer, when the polymers are employed in an electroluminescent layer of an electroluminescent device. In addition, a thin film of polymer can simply be formed by spin coating or printing. Accordingly, the manufacturing process is very simple and cost-effective. Furthermore, the mechanical properties of a thin film of a π-conjugated polymer are excellent, due to its high glass transition temperature (Tg).

However, the device using polymer compounds has several problems, including low color purity, high driving voltage and low efficiency. Many studies have been made into overcoming these problems. For example, poly(9,9-dialkylfluorene)(PAF) or fluorene-containing polymers, as disclosed in U.S. Pat. No. 6,169,163 (entitled Fluorene-containing polymers and compounds useful in the preparation thereof to Woo, et al., and issued on Jan. 2, 2001), have a high light-emitting efficiency and may achieve high efficiency in color via polymerization. However, due to the electromers resulting from oxidation by light, a defect in the polymer backbone, and the interaction between molecules due to the remaining active ends of polymer compounds after polymerization, the lifetime of the materials is insufficient. Thus, the short lifetime of blue light-emitting polymer has inhibited the development of electroluminescent display devices using the polymer.

Recently, a method has been reported in which fluorene-containing polymers are end-capped with triarylamine derivatives having hole transport capability. [T. Miteva, A. Meisel, W. Knoll, H. G. Nothofer, *Adv. Mater.* 13(8), 565 (2001)]. In this method, hole trapping occurs efficiently at the ends of the polymer, and thus the efficiency of the device may be improved. However, the lifetime stability of the device is not sufficient. Furthermore, a method of improving color purity was proposed in which a polymer containing fluorene and anthracene was end-capped with 2-bromofluorene and 2-bromo-9-fluorene to prevent the formation of excimers by the interactions between polymer molecules at its ends. (J. I. Lee, G. Klaerner and R. D. Miller, "Oxidative Stability and Its Effect on the Photoluminescence of Poly(Fluorene) Derivatives: End Group Effects," Chem. Mater. 11, 1083 (1999)) However, this method could not overcome the problem that a position of C-9 was thermally unstable under the applied voltage, thus changing its color purity. Another method was reported in which a fluorene-containing copolymer was end-capped with a functional group capable only of chain extension or crosslinking, and not having electrical characteristics, such as enhancement of the performance of a device (U.S. Pat. No. 5,708,130 entitled 2,7-aryl-9-substituted fluorenes and 9-substituted fluorene oligomers and polymers to Woo, et al. and issued on Jan. 13, 1998).

Introduction of end cappers has been in most cases limited to fluorene-containing polymers, and the known end cappers have insufficient effect on improving lifetime. Thus, there is still a need for improvement in fluorene-containing polymers.

SUMMARY OF THE INVENTION

It is therefore an object of the present invention to provide a novel compound for an organic layer of organoelectroluminescent devices.

It is also an object of the present invention to provide an improved organoelectroluminescent device.

It is further an object of the present invention to provide a spirofluorene-based polymer which has a high charge transport capability and blue light-emitting property, and has thermal, optical and electrical stability due to introduced functional moieties substituted by fluorine having an electrical property into the ends of the polymer.

It is another object of the present invention to provide an organic electroluminescent device which has improved efficiency, driving voltage and color purity by using an organic layer using the above spirofluorene-based polymer.

According to an aspect of the present invention, there is provided a spirofluorene-based polymer having the following formula 1:

Formula 1

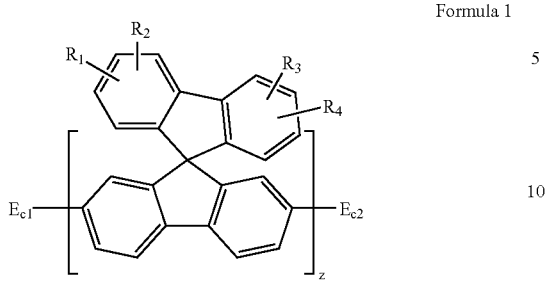

wherein $R_1$ to $R_4$ are mono-substituted or multi-substituted substituent, and are independently selected from the group consisting of a hydrogen, a hydroxy group, an amino group, a substituted or unsubstituted $C_{1-30}$ alkylamino group, a substituted or unsubstituted $C_{6-30}$ arylamino group, a substituted or unsubstituted $C_{2-30}$ heteroarylamino group, a cyano group, a halogen atom, a substituted or unsubstituted $C_{1-30}$ alkyl group, a substituted or unsubstituted $C_{3-30}$ cycloalkyl group, a substituted or unsubstituted $C_{1-30}$ alkoxy group, a substituted or unsubstituted $C_{6-30}$ aryl group, a substituted or unsubstituted $C_{6-30}$ aryloxy group, a substituted or unsubstituted $C_{6-30}$ aryl alkyl group, a substituted or unsubstituted $C_{2-30}$ heteroaryl group and a substituted or unsubstituted $C_{2-30}$ heterocyclic group;

one or both of $R_1$ and $R_2$, and $R_3$ and $R_4$ may be linked to each other to form a saturated or unsaturated ring;

$Ec_1$ and $Ec_2$ are identical or different and are selected from the moieties having the following formula 2a through 2w:

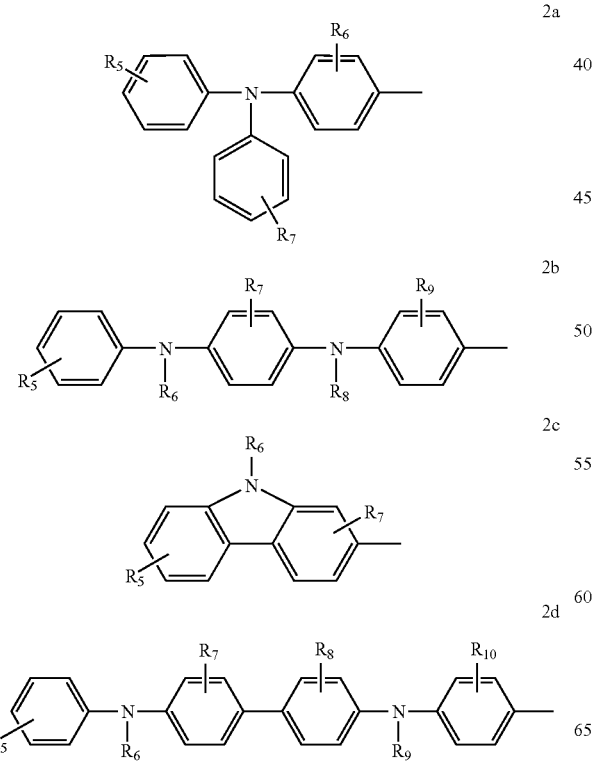

2a

2b

2c

2d

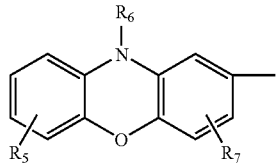 2e

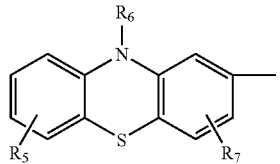 2f

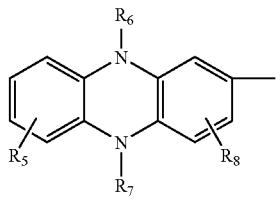 2g

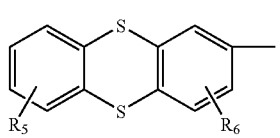 2h

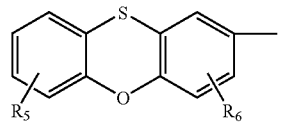 2i

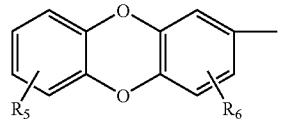 2j

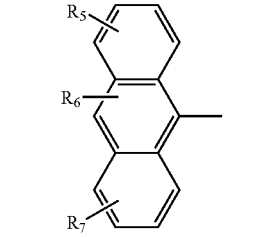 2k

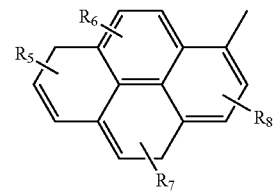 2l

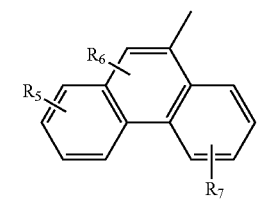 2m

-continued

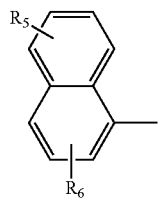
2n

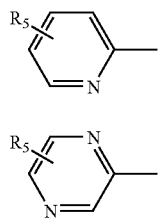
2o

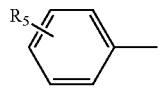
2p

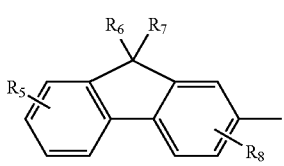
2q

2r

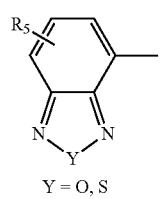
2s

Y = O, S

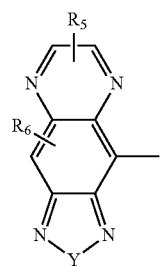
2t

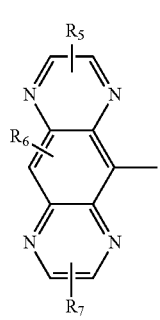
2u

-continued

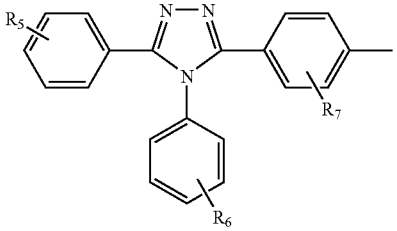
2v

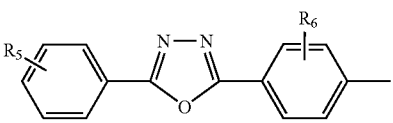
2w wherein $R_5$ to $R_{10}$ are mono-substituted or multi-substituted functional groups and are independently at least one F or —$(CF_2)_nCF_3$ (n=an integer of 1 to 12); a substituted or unsubstituted $C_{6-30}$ aryl group having at least one F or —$(CF_2)_nCF_3$ (n=an integer of 1 to 12); a substituted or unsubstituted $C_{2-30}$ heteroaryl group having at least one F or —$(CF_2)_nCF_3$ (n=an integer of 1 to 12); a substituted or unsubstituted $C_{2-30}$ heterocyclic group having at least one F or —$(CF_2)_nCF_3$ (n=an integer of 1 to 12); a substituted or unsubstituted $C_{3-30}$ cycloalkyl group having at least one F or —$(CF_2)_nCF_3$ (n=an integer of 1 to 12); or a substituted or unsubstituted $C_{6-30}$ fused aryl group having at least one F or —$(CF_2)_nCF_3$ (n=an integer of 1 to 12), and z represents the degree of polymerization and is a real number of 10 to 150.

According to another aspect of the present invention, there is provided an organic electroluminescent device comprising an organic layer between a pair of electrodes, the organic layer containing the above spirofluorene-based polymer.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
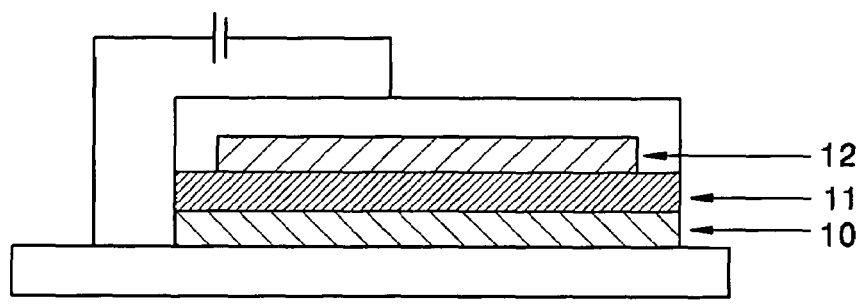
FIG. 1 is a schematic view illustrating the structure of a conventional organic electroluminescent device.

A spirofluorene-based polymer of the present invention includes a repeating unit of:

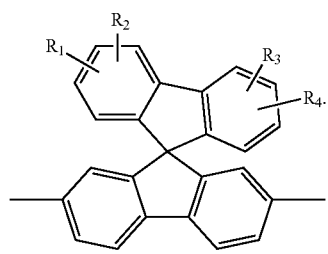

The ends of the spirofluorene-based polymer are substituted with functional moieties of $Ec_1$ and $Ec_2$ having an electrical property (the behavior of molecules is relatively freer at its ends than on its backbone). This provides a high charge transport capability and blue light-emitting property while preventing the formation of aggregates by the interactions between molecules, and excimers and exciplexes. The spirofluorene-based polymer of the present invention including the above repeating unit may be represented by Formula 1:

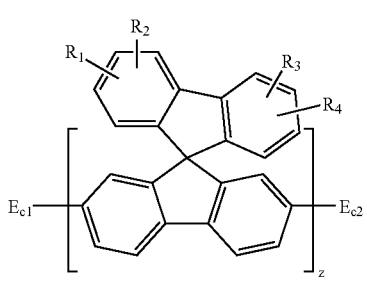

(1)

wherein $R_1$ to $R_4$ are mono-substituted or multi-substituted substituent, and are independently selected from the group consisting of a hydrogen, a hydroxy group, an amino group, a substituted or unsubstituted $C_{1-30}$ alkylamino group, a substituted or unsubstituted $C_{6-30}$ arylamino group, a substituted or unsubstituted $C_{2-30}$ heteroarylamino group, a cyano group, a halogen atom, a substituted or unsubstituted $C_{1-30}$ alkyl group, a substituted or unsubstituted $C_{3-30}$ cycloalkyl group, a substituted or unsubstituted $C_{1-30}$ alkoxy group, a substituted or unsubstituted $C_{6-30}$ aryl group, a substituted or unsubstituted $C_{6-30}$ aryloxy group, a substituted or unsubstituted $C_{6-30}$ aryl alkyl group, a substituted or unsubstituted $C_{2-30}$ heteroaryl group and a substituted or unsubstituted $C_{2-30}$ heterocyclic group, one or both of $R_1$ and $R_2$, and $R_3$ and $R_4$ may be linked to each other to form a saturated or unsaturated ring, $Ec_1$ and $Ec_2$ are identical or different and are selected from the moieties having the following formula 2a through 2w:

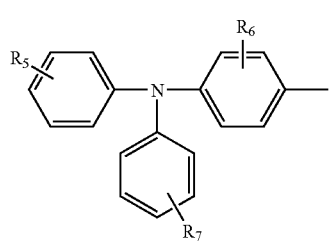

2a

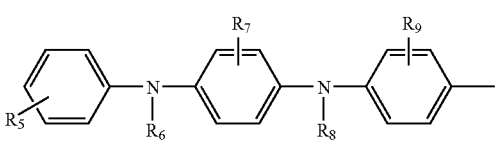

2b

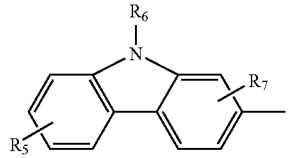

2c

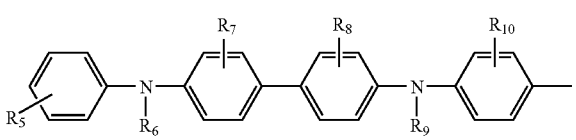

2d

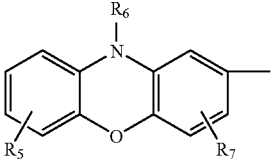

2e

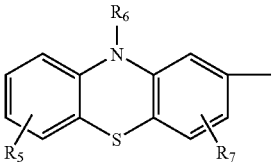

2f

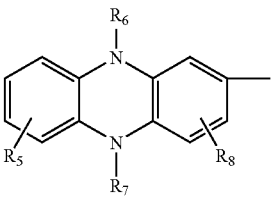

2g

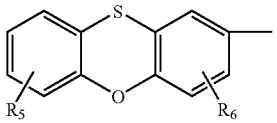

2h

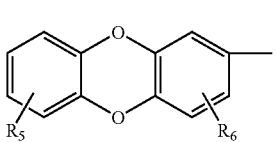

2i

2j

-continued

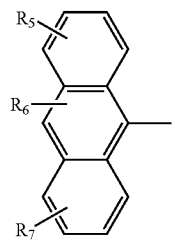
2k

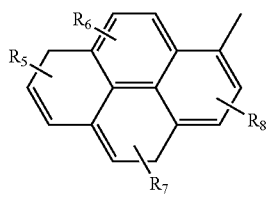
2l

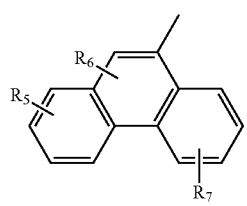
2m

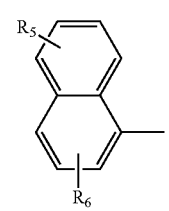
2n

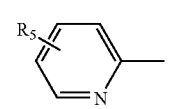
2o

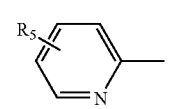
2p

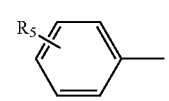
2q

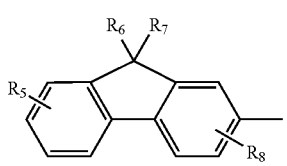
2r

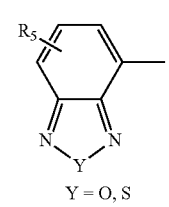
2s

Y = O, S

-continued

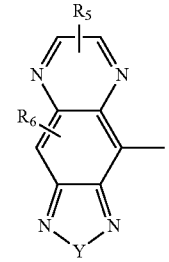
2t

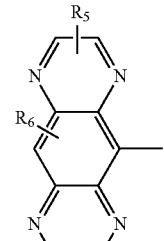
2u

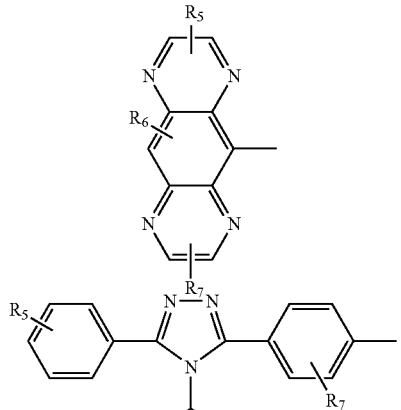
2v

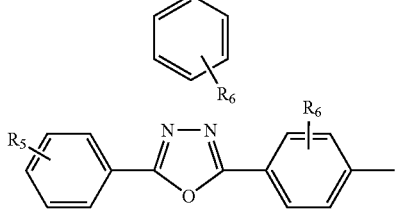
2w wherein $R_5$ to $R_{10}$ are mono-substituted or multi-substituted functional groups and are independently at least one F or —$(CF_2)_nCF_3$ (n=an integer of 1 to 12); a substituted or unsubstituted $C_{6-30}$ aryl group having at least one F or —$(CF_2)_nCF_3$ (n=an integer of 1 to 12); a substituted or unsubstituted $C_{2-30}$ heteroaryl group having at least one F or —$(CF_2)_nCF_3$ (n=an integer of 1 to 12); a substituted or unsubstituted $C_{2-30}$ heterocyclic group having at least one F or —$(CF_2)_nCF_3$ (n=an integer of 1 to 12); a substituted or unsubstituted $C_{3-30}$ cycloalkyl group having at least one F or —$(CF_2)_nCF_3$ (n=an integer of 1 to 12); or a substituted or unsubstituted $C_{6-30}$ fused aryl group having at least one F or —$(CF_2)_nCF_3$ (n=an integer of 1 to 12); and z represents the degree of polymerization and is a real number of 10 to 150.

The spirofluorene-based polymer has the following formula 3 further comprising an arylene (Ar) repeating unit;

Formula 3

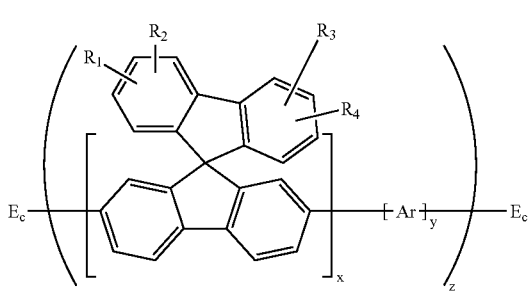

wherein $R_1$ to $R_4$, $Ec_1$ and $Ec_2$ are as defined in formula 1;

Ar is selected from the group consisting of a substituted or unsubstituted $C_{6-30}$ arylene group, a substituted or unsubstituted $C_{2-30}$ heteroarylene group, and a substituted or unsubstituted $C_{2-30}$ heterocyclic group, x is a real number of 0.01 to 0.99;

y is a real number of 0.01 to 0.99; and z represents the degree of polymerization and is a real number of 10 to 150.

In formulas 1 and 3, z is the degree of polymerization of the spirofluorene repeating unit in the polymer, x is the mixing ratio of the spirofluorene repeating unit in the polymer, and y is the mixing ratio of the arylene repeating unit in the polymer.

The spirofluorene-based polymer having formula 1 may be especially that having the following formula 4:

wherein R' and R" are identical or different, and are a $C_{1-12}$alkyl group;

m and n are independent real numbers of 0 to 2;

x is 0.01 to 0.99;

y is 0.01 to 0.99; and z is a real number of 10 to 150.

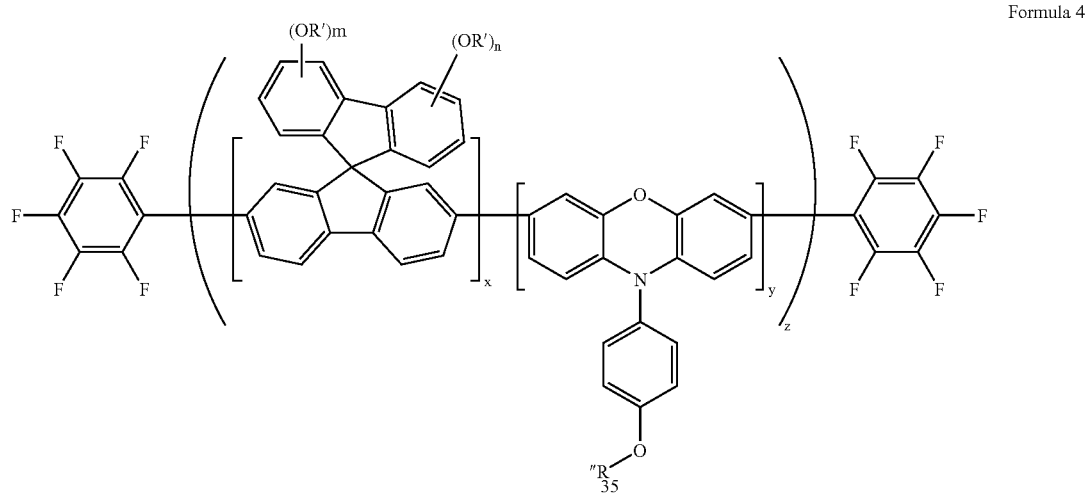

Formula 4

Examples of the polymer of formula 4 include a polymer having the following formula 5, wherein m is 0 and n is 2:

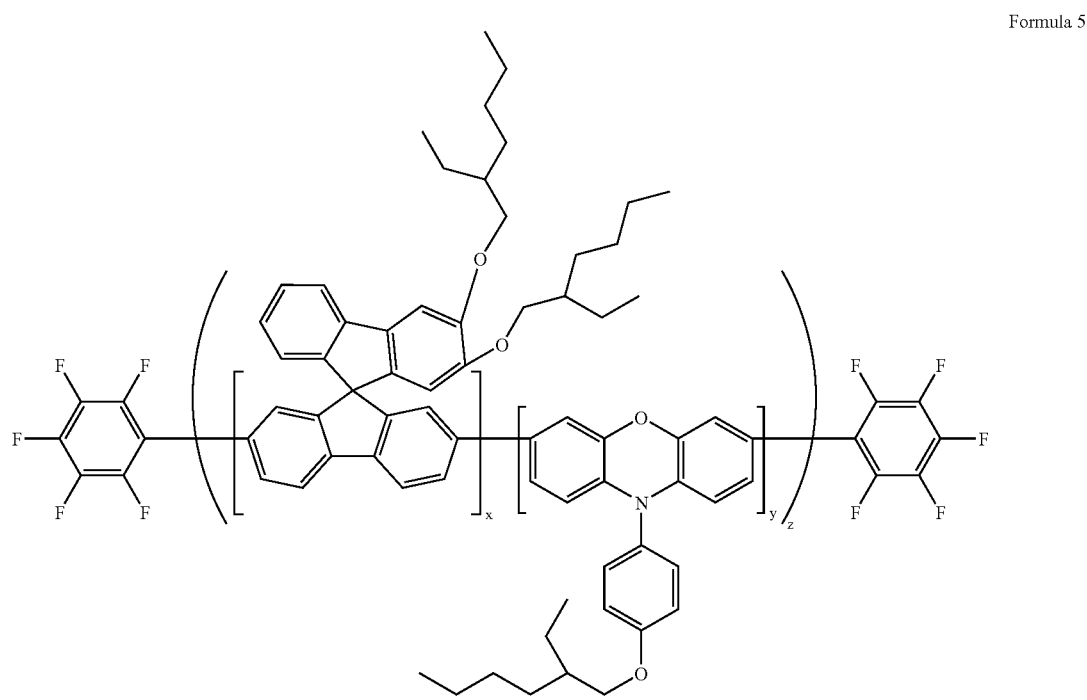

Formula 5 wherein x is 0.01 to 0.99;

y is 0.01 to 0.99; and z is a real number of 10 to 150.

The number average molecular weight (Mn) of the spirofluorene-based polymer according to the present invention may be within the range of 10,000 to 200,000. In manufacturing an electroluminescent device, the number average molecular weight is an important factor affecting the thin film formation and lifetime of the device. If the number average molecular weight is less than 10,000, crystallization is likely to occur during manufacture or use. On the other hand, if the number average molecular weight is more than 200,000, the solubility and processing properties deteriorate.

A narrower molecular weight distribution (MWD) of the polymer is known to be advantageous in terms of various electroluminescent properties (in particular, lifetime of the device). The MWD of the spirofluorene-based polymer is limited to the range of 1.5 to 5 in the present invention.

Referring to the following schemes 1 and 2, the synthesis of the spirofluorene-based polymer of the present invention will be described.

Scheme 1

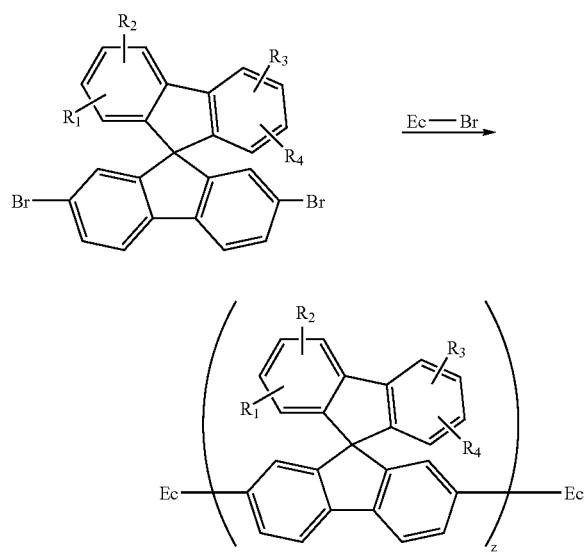

Scheme 2

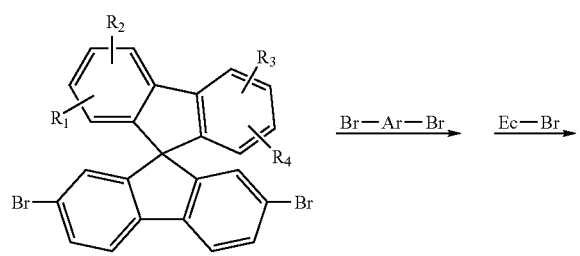

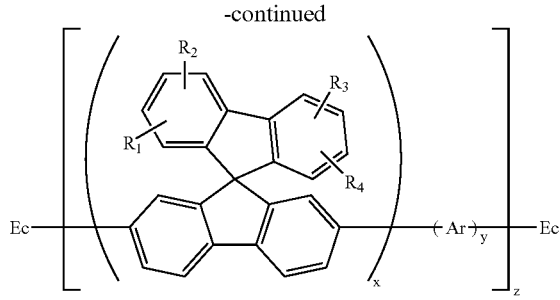

wherein $R_1$ to $R_4$, Ec, x, y and z are as defined above.

Referring to scheme 1, the spirofluorene-based polymer of formula 1 may be obtained by reacting a spirofluorene compound substituted on its ends by bromine atoms with Ec-Br. In this case, it is possible to react a spirofluorene compound substituted on its ends by chlorine or iodide atoms in place of bromine atoms with Ec-Cl or Ec-I in place of Ec-Br.

Referring to scheme 2, the polymer of formula 3 may be synthesized in the same manner as in scheme 1, except that Br—Ar—Br is further used which permits the introduction of an arylene repeating unit. It is possible to use Cl—Ar—Cl or I—Ar—I in place of Br—Ar—Br.

The term "substituted" used in the definition of the compounds in the present invention means that an element or radical is substituted with substituent(s). Examples of the substituents include a $C_{1-12}$ alkyl group, a $C_{1-12}$ alkoxy group, a halogen atom, for example, fluorine or chlorine, a $C_{1-20}$ alkyl amino group, a hydroxy group, a nitro group, a cyano group, a substituted or unsubstituted amino group (—$NH_2$, —NH(R), or —N(R')(R"), wherein R' and R" are independently a $C_{1-12}$ alkyl group), a carboxyl group, a sulfonic acid group, a phosphoric acid group, a halogenated $C_{1-20}$ alkyl group, a $C_{2-20}$ alkenyl group, a $C_{2-20}$ alkynyl group, a $C_{1-20}$ heteroalkyl group, a $C_{6-20}$ aryl group, a $C_{6-20}$ aryl alkyl group, a $C_{2-20}$ heteroaryl group, or a $C_{2-20}$ heteroaryl alkyl group.

The organic electroluminescent device according to the present invention can be manufactured by forming an organic layer, such as an electroluminescent layer, containing the spirofluorene-based polymer of formula 1. The organic electroluminescent device can have a conventional layered structure of cathode 12/electroluminescent layer 11/anode 10 as illustrated in FIG. 1. In addition, it can have the structure of cathode/buffer layer/electroluminescent layer/anode, cathode/hole transport layer/electroluminescent layer/anode, cathode/buffer layer/hole transport layer/electroluminescent layer/anode, cathode/buffer layer/hole transport layer/electroluminescent layer/electron transport layer/anode, or cathode/buffer layer/hole transport layer/electroluminescent layer/hole blocking layer/anode, but is not limited thereto.

The hole transport layer may be formed of any materials commonly used in the art. Preferably, polytriphenylamine is used, but the materials are not limited thereto.

The electron transport layer may be formed of any materials commonly used in the art. Preferably polyoxadiazole is used, but the materials are not limited thereto.

The hole blocking layer may be formed of any materials commonly used in the art. Preferably, LiF, $BaF_2$ or $MgF_2$ or the like are used, but the materials are not limited thereto.

The organic electroluminescent device of the present invention may be manufactured by conventional methods, without a need for any special apparatus or method.

Hereinafter, the present invention will be described in more detail with reference to the following examples. However, these examples are given for the purpose of illustration and are not intended to limit the scope of the invention.

Synthesis 1

Preparation of Polymer of Formula 5 (DS 9 FB)

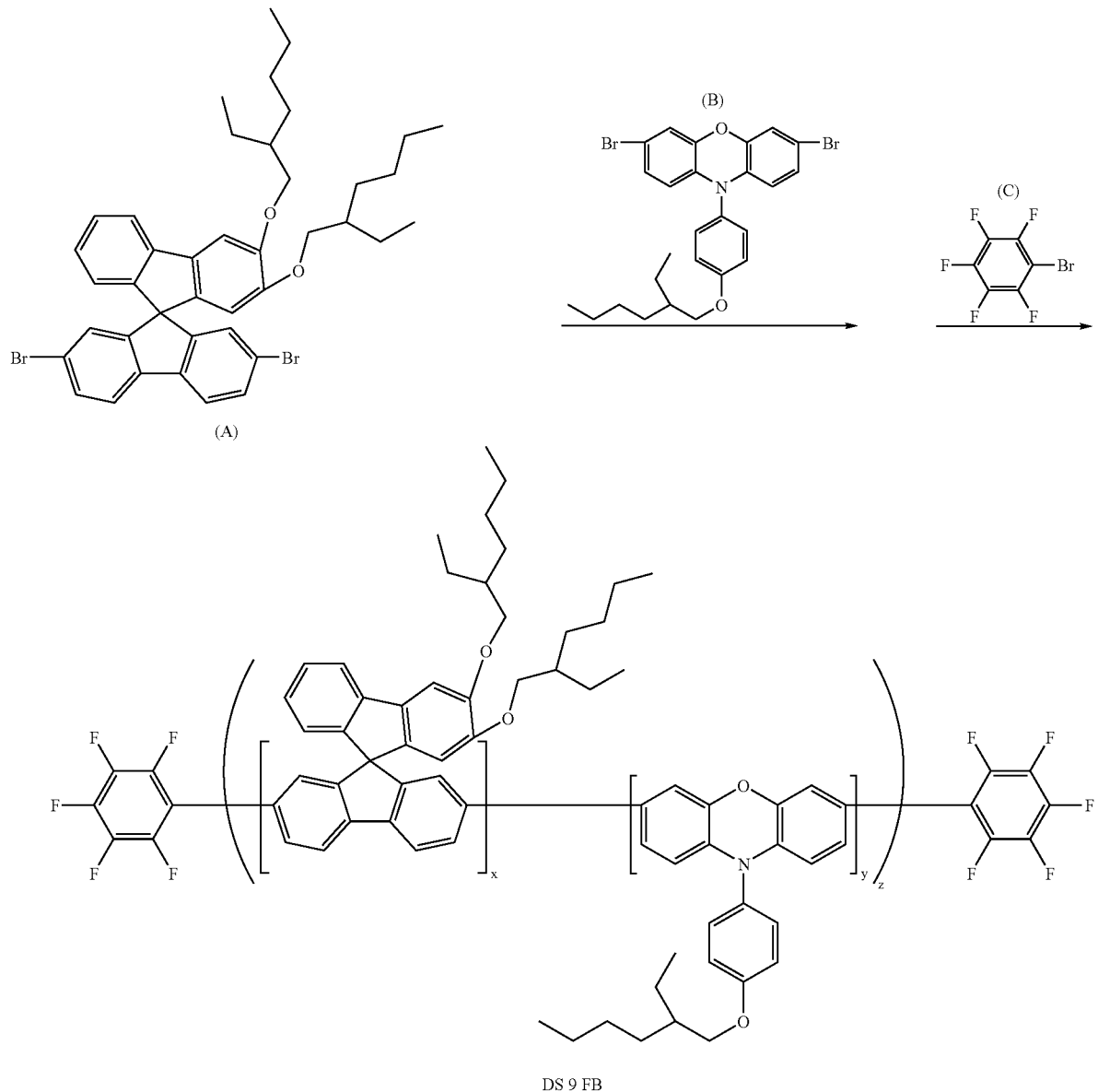

DS 9 FB

A Schlenk flask was vacuumed and refluxed with nitrogen gas several times to completely remove moisture. Then, 880 mg (3.2 mmol) of bis(1,5-cyclooctadiene)nickel(O) [Ni (COD)] and 500 mg (3.2 mmol) of bipyridal were charged into the Schlenk flask in a glove box, and the flask was vacuumed and refluxed with nitrogen gas several times again. 10 ml of anhydrous dimethylformamide (DMF), 346 mg (3.2 mmol) of 1,5-cyclooctadiene (COD) and 10 ml of anhydrous toluene were added to the flask under a nitrogen atmosphere. After the mixture was stirred at 80° C. for 30 min, 1.05 g (1.44 mmol) of 2,7-dibromo-2',3'-di(2-ethyl)hexyloxyspirofluorene (A) and 87 mg (0.16 mmol) of brominated phenoxazine compound (B) diluted with 10 ml of toluene were added to the mixture. Next, 10 ml of toluene was added to the mixture while washing materials adhered to the flask wall, and then the mixture was stirred at 80° C. for 4 days. Then, 27.6 mg (0.112 mmol) of bromopentafluorobenzene (C) was added to the mixture and stirred at 80° C. for approximately 1 day. After stirring, the temperature of the reaction mixture was lowered to 60° C. Then, the reaction mixture was poured into a mixture of HCl, acetone, and methanol (volume ratio 1:1:2) to form precipitates. The precipitates thus formed were dissolved in chloroform, and then re-precipitated in methanol. Then, the Soxhlet method was performed to obtain 450 mg (DS 9 FB) of the polymer of formula 5, wherein x is 0.9 and y is 0.1. The resulting polymer was analyzed by gel permeation chromatography (GPC), showing that the number average molecular weight (Mn) was 167,000 and the molecular weight distribution (MWD) was 1.88.

Comparative Synthesis 1

Preparation of Blue Light-Emitting Polymers (1) Preparation of the Polymer of Formula 6 (DS 9 no)

A Schlenk flask was vacuumed and refluxed with nitrogen gas several times to completely remove moisture. Then, 880 mg (3.2 mmol) of Ni(COD) and 500 mg (3.2 mmol) of bipyridal were charged into the Schlenk flask in a glove box, and the flask was vacuumed and refluxed with nitrogen gas several times again. 10 ml of anhydrous DMF, 346 mg (3.2 mmol) of 1,5-cyclooctadiene (COD) and 10 ml of anhydrous toluene were added to the flask under a nitrogen atmosphere. After the mixture was stirred at 80° C. for 30 min, 1.05 g (1.44 mmol) of 2,7-dibromo-2',3'-di(2-ethyl)hexyloxyspirofluorene (A) and 87 mg (0.16 mmol) of brominated phenoxazine compound (B) diluted with 10 ml of toluene were added to the mixture.

Next, 10 ml of toluene was added to the mixture while washing materials adhered to the flask wall, and then the mixture was stirred at 80° C. for 4 days. After stirring, the temperature of the reaction mixture was lowered to 60° C. Then, the reaction mixture was poured into a 1:1:2 mixture of HCl, acetone, and methanol to form precipitates. The precipitates thus formed were dissolved in chloroform, and then re-precipitated in methanol. Then, the Soxhlet method was performed to obtain 450 mg of the polymer of the following formula 6 (no end capping DS 9).

The resulting polymer was analyzed by GPC, showing that the number average molecular weight (Mn) was 126,000 and the molecular weight distribution (MWD) was 1.93.

(2) Preparation of a Polymer using an End Capper which Does Not Contain a Fluorine A Schlenk flask was vacuumed and refluxed with nitrogen gas several times to completely remove moisture. Then, 880 mg (3.2 mmol) of Ni(COD) and 500 mg (3.2 mmol) of bipyridal were charged into the Schlenk flask in a glove box, and the flask was vacuumed and refluxed with nitrogen gas several times again. 10 ml of anhydrous DMF, 346 mg (3.2 mmol) of 1,5-cyclooctadiene (COD) and 10 ml of anhydrous toluene were added to the flask under a nitrogen atmosphere. After the mixture was stirred at 80° C. for 30 min, 1.05 g (1.44 mmol) of 2,7-dibromo-2',3'-di(2-ethyl)hexyloxyspirofluorene (A) and 87 mg (0.16 mmol) of brominated phenoxazine compound (B) diluted with 10 ml of toluene were added to the mixture. Next, 10 ml of toluene was added to the mixture while washing materials adhered to the flask wall, and then the mixture was stirred at 80° C. for 4 days. Then, 27.6 mg (0.112 mmol) of bromoanthracene (Ant), 27.6 mg (0.112 mmol) of bromotritolylamine (TTA), 27.6 mg (0.112 mmol) of bromopyrene (Pyrene), 27.6 mg (0.112 mmol) of bromotriazole (TAZ) and 27.6 mg (0.112 mmol) of bromophenothiazine (Pthz) were added to the mixture and stirred at 80° C. for approximately 1 day.

After stirring, the temperature of the reaction mixture was lowered to 60° C. Then, the reaction mixture was poured into a mixture of HCl, acetone, and methanol (volume ratio 1:1:2) to form precipitates. The precipitates thus formed were dissolved in chloroform, and then re-precipitated in methanol. Then, the Soxhlet method was performed to obtain the respective polymers DS 9 Ant, DS 9 TTA, DS 9 Pyrene, DS 9 TAZ and DS 9 Pthz having the following formula 7:

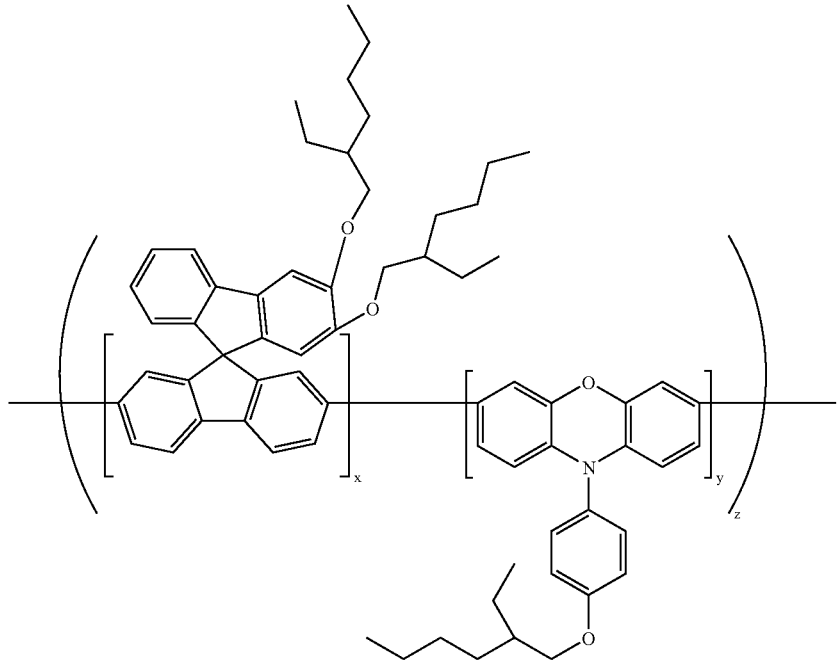

Formula 6 wherein, x is 0.9 and y is 0.1.

Formula 7
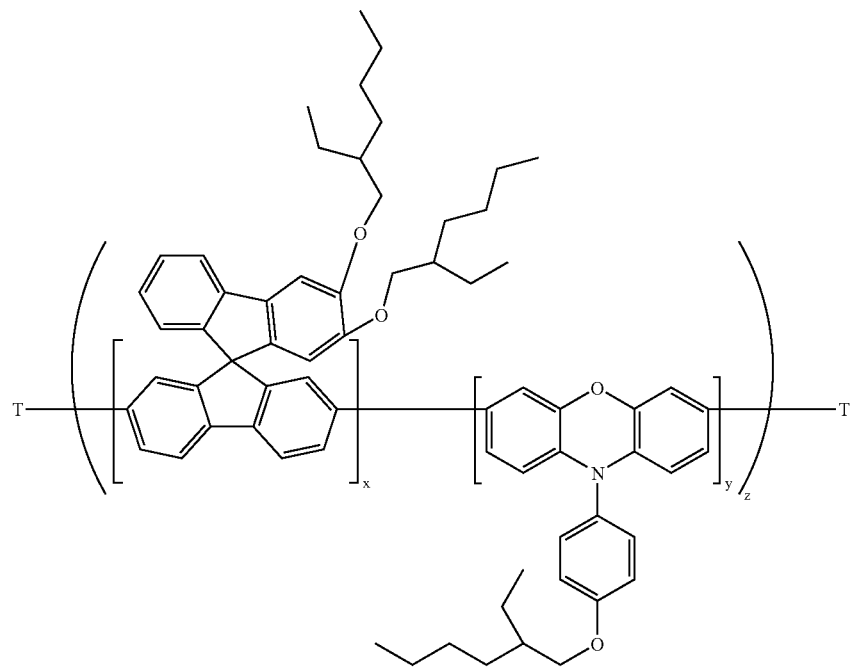
wherein x is 0.9 and y is 0.1, and T represents one of the following formulas:
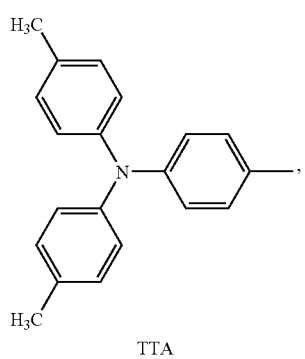
TTA
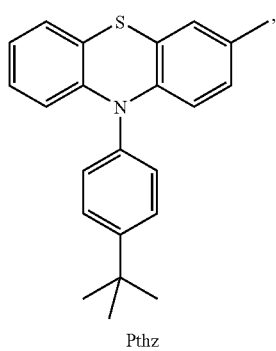
Pthz
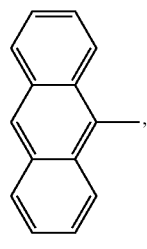
Ant
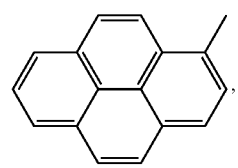
Pyrene
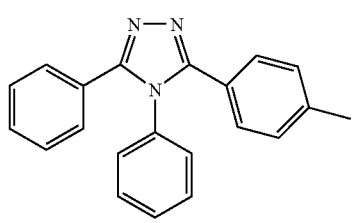
TAZ The resulting polymers were analyzed by GPC, showing that the number average molecular weights (Mn) were each within the range of 110,000 to 190,000.

Example 1

Manufacture of Organic Electroluminescent Device

An electroluminescent (EL) device was manufactured using the polymer of formula 5 prepared according to Synthesis 1, as follows.

A transparent electrode substrate of glass coated with ITO (indium-tin oxide) was first cleaned. Then the ITO was patterned by using a photoresist resin and an etchant, and the resulting substrate was cleaned again. Batron P 4083 (available from Bayer) as a conductive buffer layer was coated onto the substrate to a thickness of about 800 Å, and then baked at 180° C. for about 1 hour. A solution for an electroluminescent layer was prepared by dissolving 0.1 parts by weight of the polymer of formula 5 in 99.9 parts by weight of toluene and then filtering through a 0.2 mm filter. The solution was spin coated onto the above buffer layer. After baking, the solvent was removed in a vacuum oven to form a thin film of the polymer. In the spin coating, the concentration of the polymer solution and the spin speed were controlled so that the thickness of the thin film was within the range of about 80 nm. Ca and Al were sequentially vacuum-deposited onto the above light-emitting thin polymer film using a vacuum depositor under a vacuum of not more than $4 \times 10^{-6}$ torr. When depositing, the thickness and the growth rate of the layer were controlled by a crystal sensor. The EL device thus manufactured was a single-layered device having a structure of ITO/PEDOT luminescent polymer/$BAF_2$/Ca/Al, and had a light-emitting area of 4 mm$^2$. The schematic structure of the device is shown in FIG. 1.

Comparative Example 1

Manufacture of Organic Electroluminescent Device

Electroluminescent devices were respectively manufactured according to the same procedure as in Example 1, except that DS 9 Ant, DS 9 TTA, DS 9 Pyrene, DS 9 TAZ and DS 9 Pthz having the formula 7 were used in place of the polymer of formula 5 in forming an electroluminescent layer.

The organic electroluminescent devices manufactured in Example 1 and Comparative Example 1 were evaluated for their electroluminescence (EL) properties. The results are summarized in Table 1.

TABLE 1

| | | EL property | | | | |
|---|---|---|---|---|---|---|
| | Polymer | EL (λmax) | Efficiency (cd/A) | Maximum efficiency | Driving voltage | Half-time (hr) |
| Example 1 | DS 9 FB | 470 | 6.87 | 6.99 | 2.7 | 160 |
| Comparative Example 1 | DS 9 no | 470 | 5.7 | 6.30 | 3.0 | 135 |
| | DS 9 TTA | 470 | 4.49 | 5.04 | 3.2 | 92 |
| | DS 9 Pthz | 470 | 6.21 | 6.58 | 2.9 | 142 |
| | DS 9 Ant | 470 | 6.7 | 6.85 | 2.8 | 138 |
| | DS 9 | 470 | 5.62 | 6.01 | 3.0 | 132 |
| | DS 9 TAZ | 470 | 6.62 | 6.92 | 2.7 | 121 |

As seen from Table 1, the organic electroluminescent device of Example 1 exhibited excellent light-emitting efficiency and maximum efficiency, reduced driving voltage, and improved lifetime, compared with Comparative Example 1.

Figure 2:
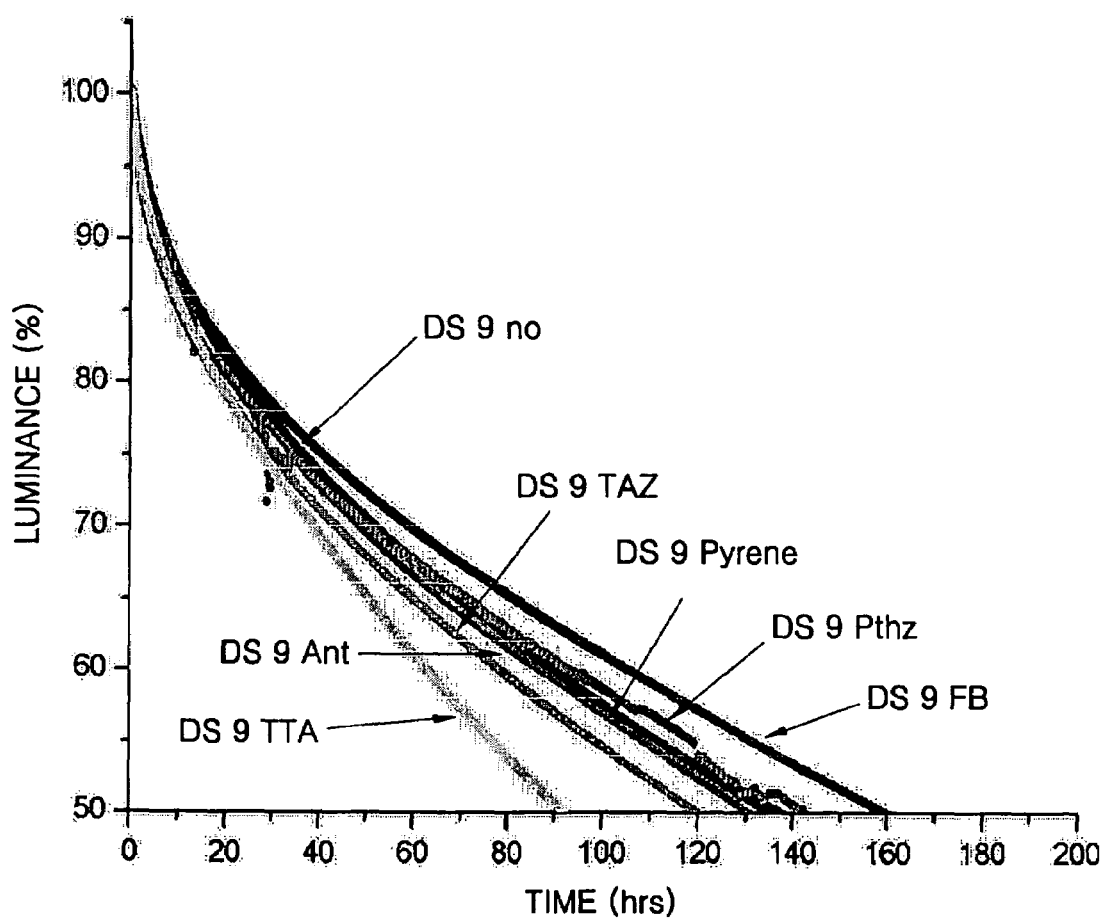
FIG. 2 is a graph of luminance versus time for organic electroluminescent devices manufactured according to Example 1 of the present invention and Comparative Example 1.

Also, the relationship of time to luminance of the devices using the polymers prepared in Example 1 and Comparative Example 1 are illustrated in FIG. 2. In the evaluation, the forward bias voltage as a direct voltage was used for the driving voltage. The devices showed typical properties of rectifying diodes. Especially, the device using the polymer prepared in Example 1 showed excellent stability, in that the initial voltage-current density characteristics were maintained even after driving had been repeated several times. Also, its lifetime at 800 nit was more thermally stable for longer than the devices using the polymer prepared in Comparative Example 1.

As described above, the spirofluorene-based polymer according to the present invention prevents the formation of excimers and exciplexes due to interactions between molecules, and shows a high charge transport capability and blue light-emitting property. The organic electroluminescent device using an organic layer containing the spirofluorene-based polymer according to the present invention has improved efficiency, reduced driving voltage, improved color purity, and excellent thermal, optical and electrical stability.

The spirofluorene-based polymer according to the present invention is a useful material for forming an organic layer, such as an electroluminescent layer in a organic electroluminescent layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A spirofluorene-based polymer having Formula 3:

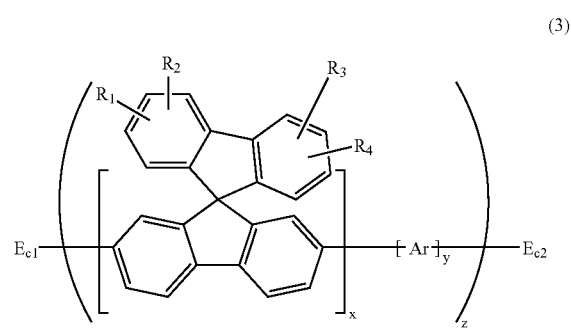

(3)

wherein each of $R_1$ to $R_4$ is a mono-substituted or multi-substituted substituent, and is independently selected from the group consisting of a hydrogen, a hydroxy group, an amino group, a substituted or unsubstituted $C_{1-30}$ alkylamino group, a substituted or unsubstituted $C_{6-30}$ arylamino group, a substituted or unsubstituted $C_{2-30}$ heteroarylamino group, a cyano group, a halogen atom, a substituted or unsubstituted $C_{1-30}$ alkyl group, a substituted or unsubstituted $C_{3-30}$ cycloalkyl group, a substituted or unsubstituted $C_{1-30}$ alkoxy group, a substituted or unsubstituted $C_{6-30}$ aryl group, a substituted or unsubstituted $C_{6-30}$ aryloxy group, a substituted or unsubstituted $C_{6-30}$ aryl alkyl group, a substituted or unsubstituted $C_{6-30}$ heteroaryl group and a substituted or unsubstituted $C_{2-30}$ heterocyclic group, at least one of $R_1$ and $R_2$, and $R_3$ and $R_4$ may be linked to each other to form a saturated or unsaturated ring, $Ec_1$ and $Ec_2$ are independently selected from the group consisting of the moieties having Formulae 2a through 2w:
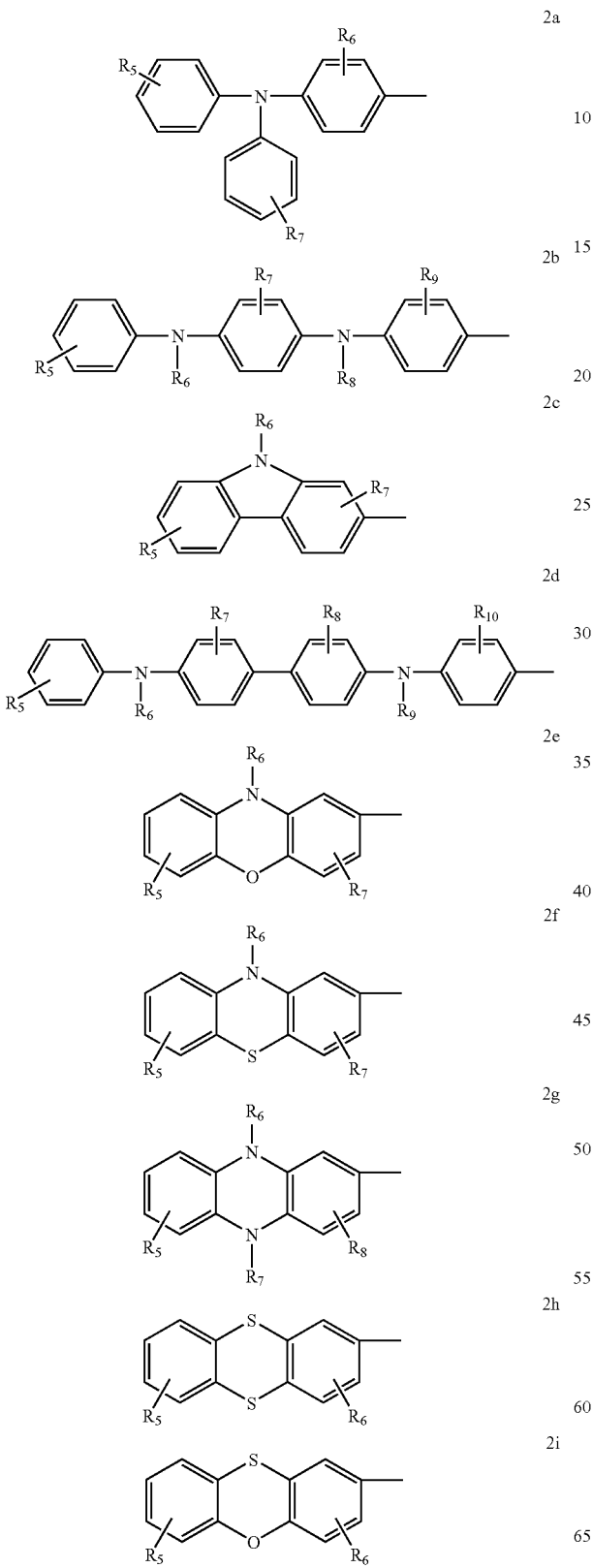
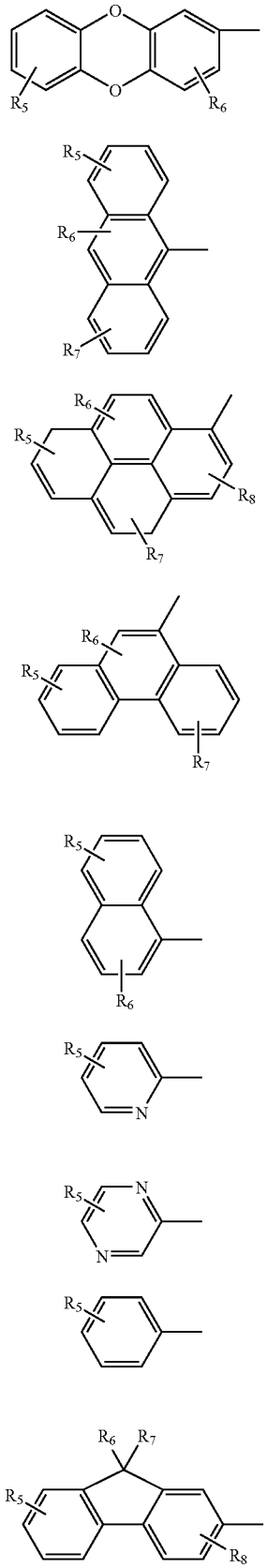

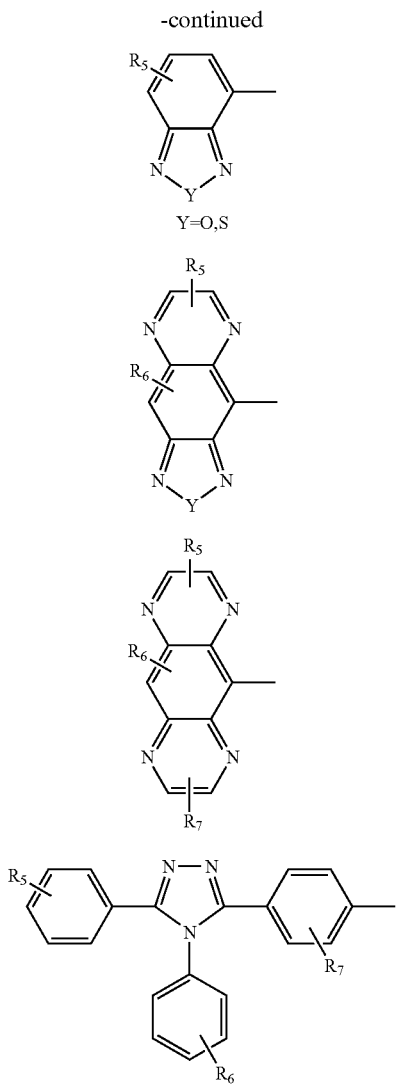

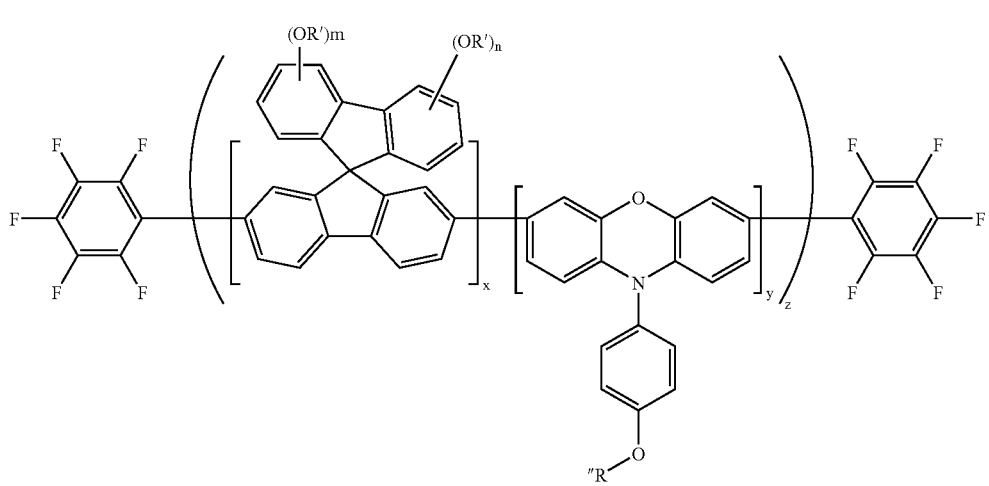

wherein $R_5$ to $R_{10}$ are mono-substituted or multi-substituted functional groups and are independently selected from the group consisting of at least one F or —$(CF_2)_nCF_3$ where n=an integer of 1 to 12, a substituted or unsubstituted $C_{6-30}$ aryl group having at least one F or —$(CF_2)_nCF_3$ where n=an integer of 1 to 12, a substituted or unsubstituted $C_{2-30}$ heteroaryl group having at least one F or —$(CF_2)_nCF_3$ where n=an integer of 1 to 12, a substituted or unsubstituted $C_{2-30}$ heterocyclic group having at least one F or —$(CF_2)_nCF_3$ where n=an integer of 1 to 12, a substituted or unsubstituted $C_{3-30}$ cycloalkyl group having at least one F or —$(CF_2)_nCF_3$ where n=an integer of 1 to 12, and a substituted or unsubstituted $C_{6-30}$ fused aryl group having at least one F or —$(CF_2)_nCF_3$ where n=an integer of 1 to 12;

Ar is selected from the group consisting of a substituted or unsubstituted $C_{6-30}$ arylene group, a substituted or unsubstituted $C_{2-30}$ heteroarylene group, and a substituted or unsubstituted $C_{2-30}$ heterocyclic group;

x is a real number of 1 or 0.01 to 0.99;

y is a real number of 0 or 0.01 to 0.99; and z represents the degree of polymerization and is a real number of 10 to 150.

2. The polymer of claim 1, wherein x is a real number of 0.01 to 0.99; and y is a real number of 0.01 to 0.99.

3. The polymer of claim 1, wherein the polymer has a number average molecular weight ranging from 10,000 to 200,000.

4. The polymer of claim 1, wherein x is 1, and Y is 0.

5. The polymer of claim 2, wherein the polymer has Formula 4:

wherein each of R' and R" is independently a $C_{1-12}$ alkyl group;

m and n are independent real numbers of 0 to 2;

x is 0.01 to 0.99;

y is 0.01 to 0.99; and z is a real number of 10 to 150.

6. The polymer of claim 5, wherein the polymer has Formula 5:

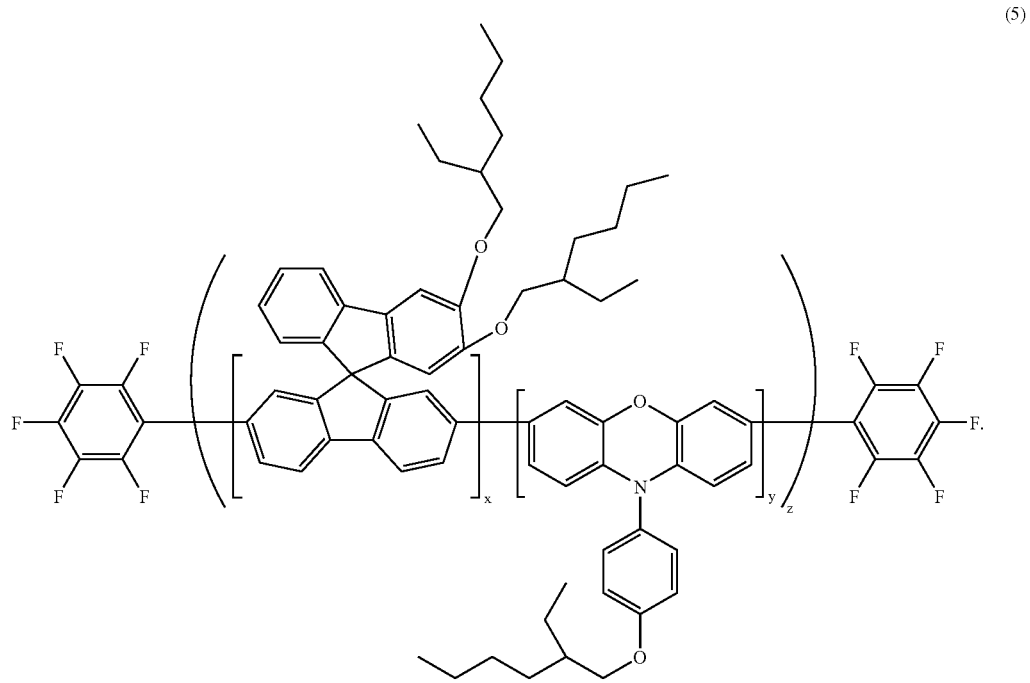

(5)

7. An organic electroluminescent device comprising an organic layer between a pair of electrodes, the organic layer containing the spirofluorene-based polymer of claim 1.

8. An organic electroluminescent device, comprising:

a pair of electrodes; and an organic layer between said pair of electrodes, the organic layer containing a spirofluorene-based polymer represented by Formula 3:

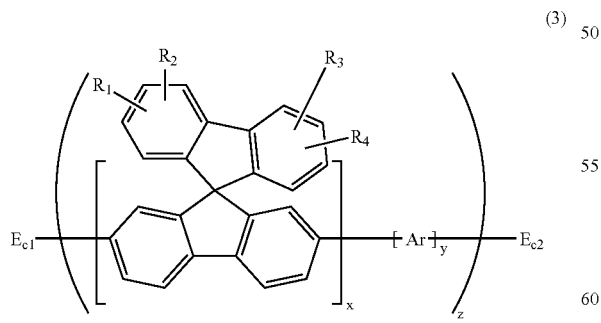

(3)

wherein each of $R_1$ to $R_1$ is a mono-substituted or multi-substituted substituent, and is independently selected from the group consisting of a hydrogen, a hydroxy group, an amino group, a substituted or unsubstituted $C_{1-30}$ alkylamino group, a substituted or unsubstituted $C_{6-30}$ arylamino group, a substituted or unsubstituted $C_{2-30}$ heteroarylamino group, a cyano group, a halogen atom, a substituted or unsubstituted $C_{1-30}$ alkyl group, a substituted or unsubstituted $C_{3-30}$ cycloalkyl group, a substituted or unsubstituted $C_{1-30}$ alkoxy group, a substituted or unsubstituted $C_{6-30}$ aryl group, a substituted or unsubstituted $C_{6-30}$ aryloxy group, a substituted or unsubstituted $C_{6-30}$ aryl alkyl group, a substituted or unsubstituted $C_{2-30}$ heteroaryl group and a substituted or unsubstituted $C_{2-30}$ heterocyclic group;

at least one of $R_1$ and $R_2$, and $R_3$ and $R_4$ may be linked to each other to form a saturated or unsaturated ring;

$Ec_1$ and $Ec_2$ are independently selected from the group consisting of the moieties having Formulae 2a through 2w:

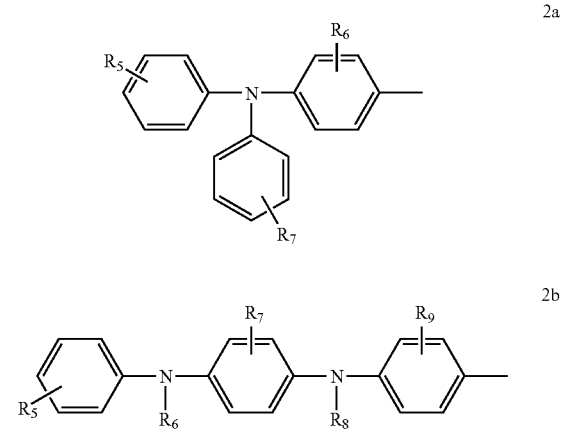

-continued

-continued

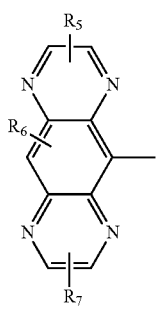

2u

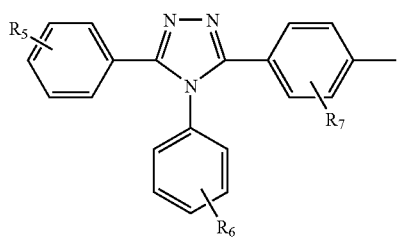

2v

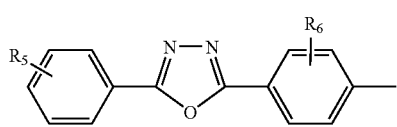

2w wherein $R_5$ to $R_{10}$ are mono-substituted or multi-substituted functional groups and are independently selected from the group consisting of at least one F or —$(CF_2)_nCF_3$ where n=an integer of 1 to 12, a substituted or unsubstituted $C_{6-30}$ aryl group having at least one F or —$(CF_2)_nCF_3$ where n=an integer of 1 to 12, a substituted or unsubstituted $C_{2-30}$ heteroaryl group having at least one F or —$(CF_2)_nCF_3$ where n=an integer of 1 to 12, a substituted or unsubstituted $C_{2-30}$ heterocyclic group having at least one F or —$(CF_2)_nCF_3$ where n=an integer of 1 to 12, a substituted or unsubstituted $C_{3-30}$ cycloalkyl group having at least one F or —$(CF_2)_nCF_3$ where n=an integer of 1 to 12, and a substituted or unsubstituted $C_{6-30}$ fused aryl group having at least one F or —$(CF_2)_nCF_3$ where n=an integer of 1 to 12;

Ar is selected from the group consisting of a substituted or unsubstituted $C_{6-30}$ arylene group, a substituted or unsubstituted $C_{2-30}$ heteroarylene group, and a substituted or unsubstituted $C_{2-30}$ heterocyclic group;

x is a real number of 1 or 0.01 to 0.99;

y is a real number of 0 or 0.01 to 0.99; and z represents the degree of polymerization and is a real number of 10 to 150.

9. The organic electroluminescent device of claim 8, wherein the organic layer is an electroluminescent layer.

10. The organic electroluminescent device of claim 8, wherein x is a real number of 0.01 to 0.99; and y is a real number of 0.01 to 0.99.

11. The organic electroluminescent device of claim 8, wherein the polymer has a number average molecular weight ranging from 10,000 to 200,000.

12. The organic electroluminescent device of claim 8, wherein x is 1, and y is 0.

13. The organic electroluminescent device of claim 10, wherein the polymer has Formula 4:

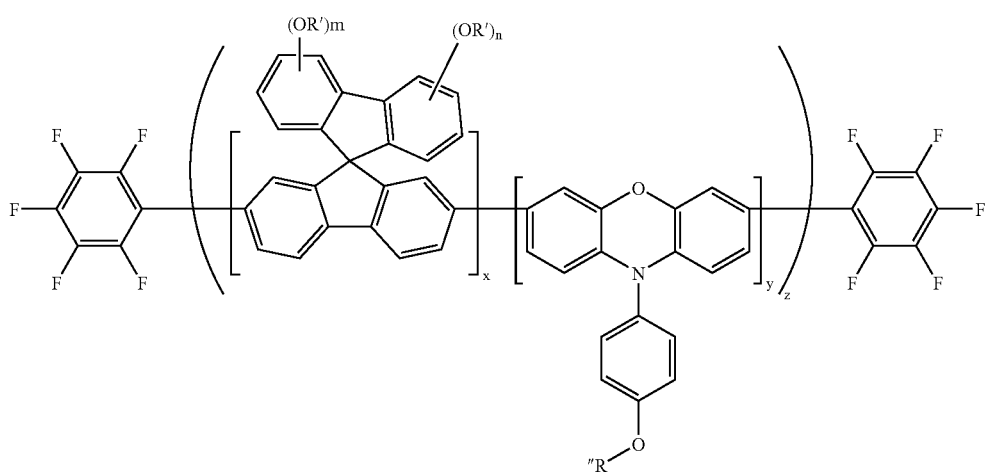

(4)

wherein each of R' and R" is independently a $C_{1-12}$ alkyl group;

m and n are independent real numbers of 0 to 2;

x is 0.01 to 0.99;

y is 0.01 to 0.99; and z is a real number of 10 to 150.

14. The organic electroluminescent device of claim 12, wherein the polymer has Formula 5:

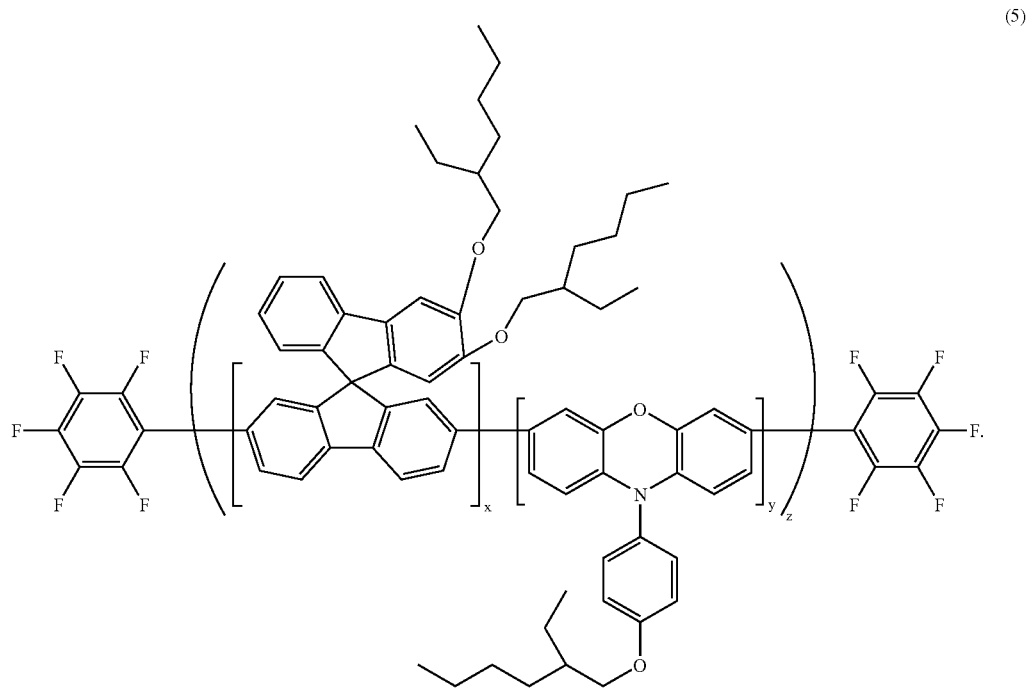

(5)

15. The organic electroluminescent device of claim 8, wherein the molecular weight distribution of the spirofluorene-based polymer ranges from 1.5 to 5.

16. An organic electroluminescent device, comprising:
a pair of electrodes; and
an electroluminescent layer between said pair of electrodes, the electroluminescent layer containing a spirofluorene-based polymer having a number average molecular weight ranging from 10,000 to 200,000, said spirofluorene-based polymer represented by Formula 3:

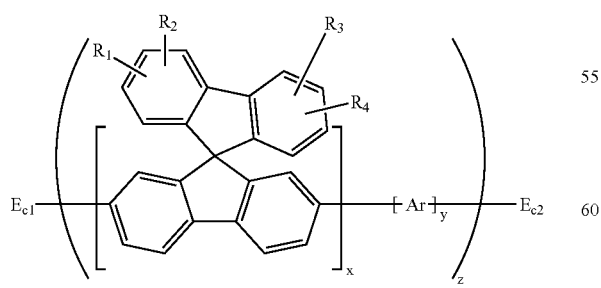

(3)

wherein each of $R_1$ to $R_4$ is a mono-substituted or multi-substituted substituent, and is independently selected from the group consisting of a hydrogen, a hydroxy group, an amino group, a substituted or unsubstituted $C_{1-30}$ alkylamino group, a substituted or unsubstituted $C_{6-30}$ arylamino group, a substituted or unsubstituted $C_{2-30}$ heteroarylamino group, a cyano group, a halogen atom, a substituted or unsubstituted $C_{1-30}$ alkyl group, a substituted or unsubstituted $C_{3-30}$ cycloalkyl group, a substituted or unsubstituted $C_{1-30}$ alkoxy group, a substituted or unsubstituted $C_{6-30}$ aryl group, a substituted or unsubstituted $C_{6-30}$ aryloxy group, a substituted or unsubstituted $C_{6-30}$ aryl alkyl group, a substituted or unsubstituted $C_{2-30}$ heteroaryl group and a substituted or unsubstituted $C_{2-30}$ heterocyclic group;

at least one of $R_1$ and $R_2$, and $R_3$ and $R_4$ may be linked to each other to form a saturated or unsaturated ring;

$Ec_1$ and $Ec_2$ are independently selected from the group consisting of the moieties having the formulae 2a through 2w:

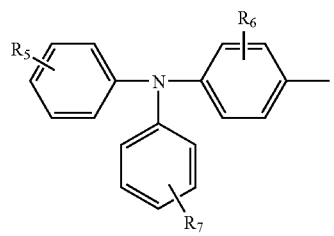

2a

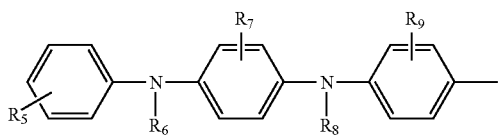

2b

-continued
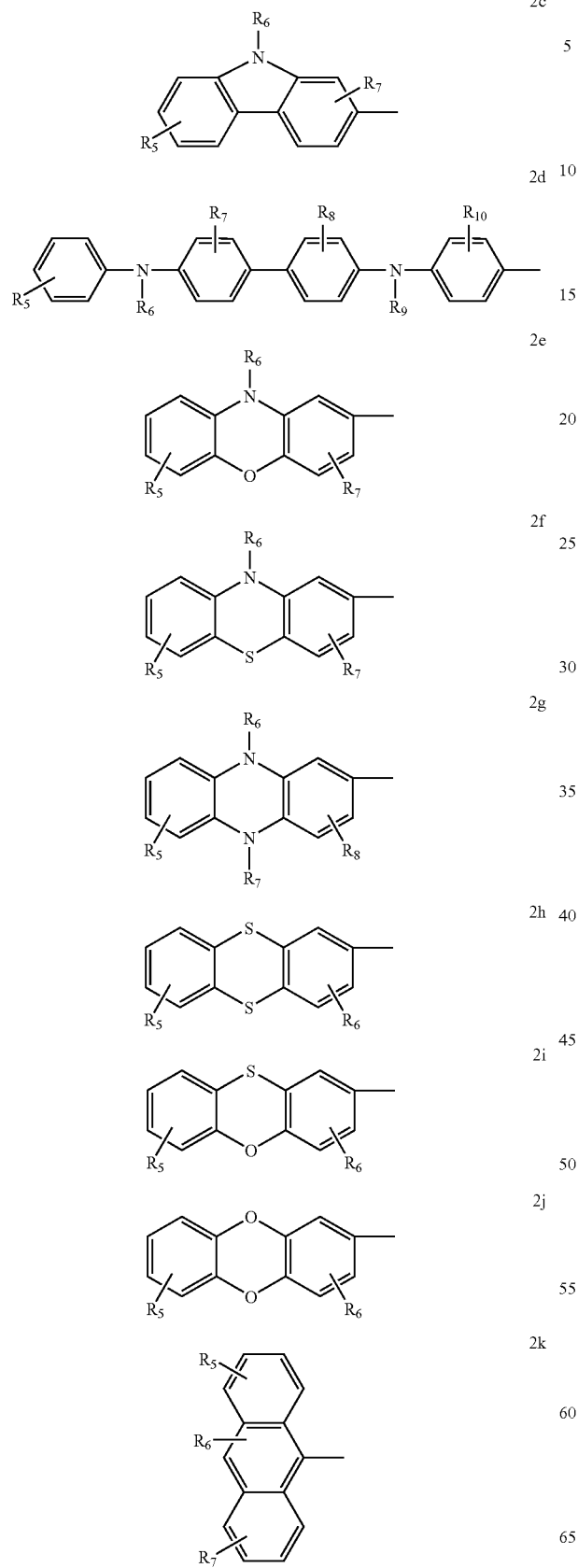
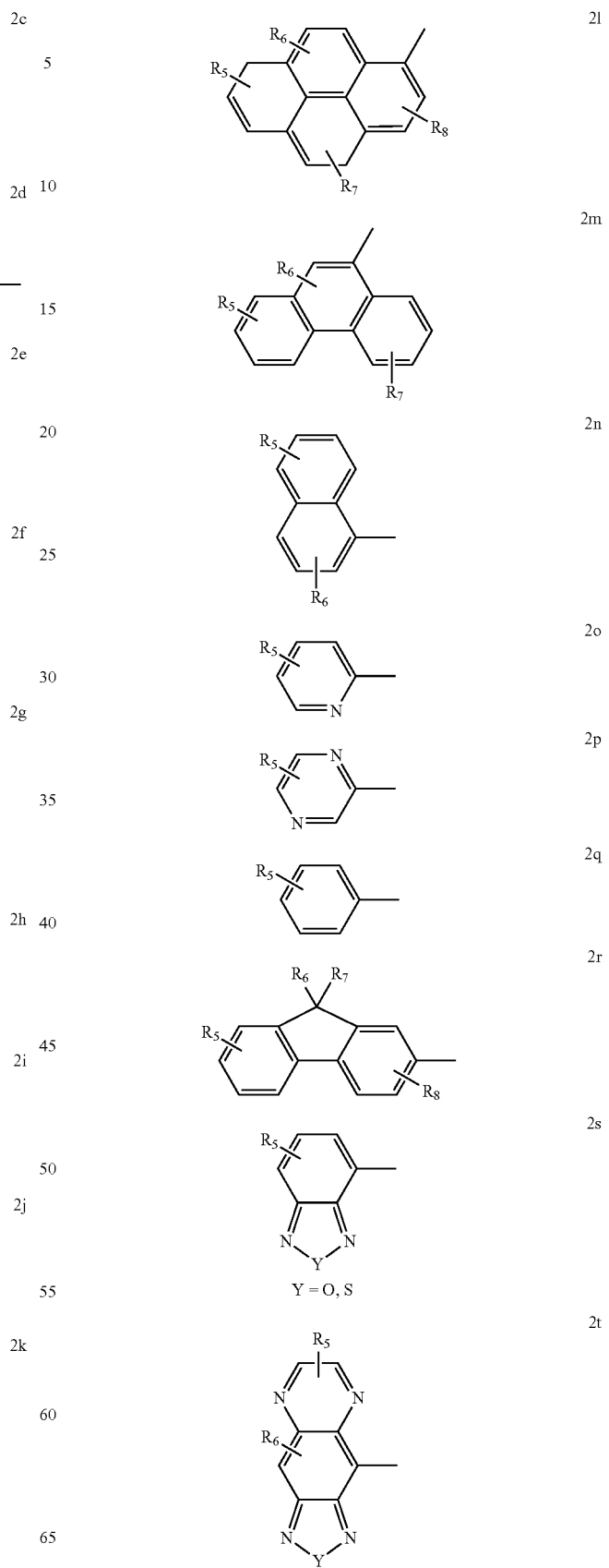
Y = O, S

-continued

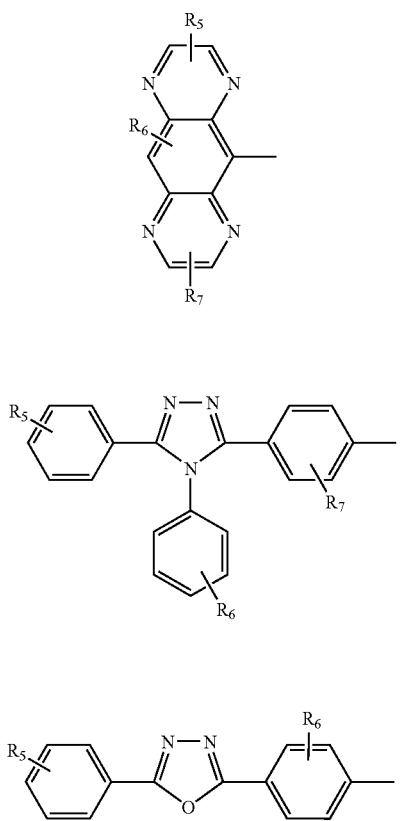

wherein $R_5$ to $R_{10}$ are mono-substituted or multi-substituted functional groups and are independently selected from the group consisting of at least one F or —$(CF_2)_nCF_3$ where n=an integer of 1 to 12, a substituted or unsubstituted $C_{6-30}$ aryl group having at least one F or —$(CF_2)_nCF_3$ where n=an integer of 1 to 12, a substituted or unsubstituted $C_{2-30}$ heteroaryl group having at least one F or —$(CF_2)_nCF_3$ where n=an integer of 1 to 12, a substituted or unsubstituted $C_{2-30}$ heterocyclic group having at least one F or —$(CF_2)_nCF_3$ where n=an integer of 1 to 12, a substituted or unsubstituted $C_{3-30}$ cycloalkyl group having at least one F or —$(CF_2)_nCF_3$ where n=an integer of 1 to 12, and a substituted or unsubstituted $C_{6-30}$ fused aryl group having at least one F or —$(CF_2)_nCF_3$ where n=an integer of 1 to 12;

Ar is selected from the group consisting of a substituted or unsubstituted $C_{6-30}$ arylene group, a substituted or unsubstituted $C_{2-30}$ heteroarylene group, and a substituted or unsubstituted $C_{2-30}$ heterocyclic group;

x is a real number of 1 or 0.01 to 0.99:

y is a real number of 0 or 0.01 to 0.99: and z represents the degree of polymerization and is a real number of 10 to 150.

17. The organic electroluminescent device of claim 16, wherein x is a real number of 0.01 to 0.99; and y is a real number of 0.01 to 0.99.

18. The organic electroluminescent device of claim 17, wherein the polymer is represented by Formula 4:

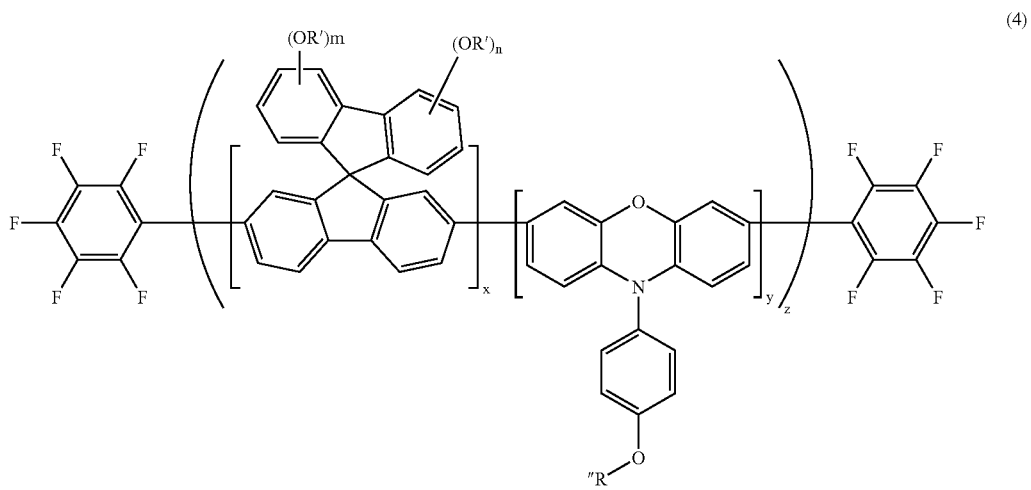

(4)

wherein each of R' and R" is independently a $C_{1-12}$ alkyl group, m and n are independent real numbers of 0 to 2;

x is 0.01 to 0.99;

y is 0.01 to 0.99; and z is a real number of 10 to 150.

19. The organic electroluminescent device of claim 18, wherein the polymer is represented by Formula 5:

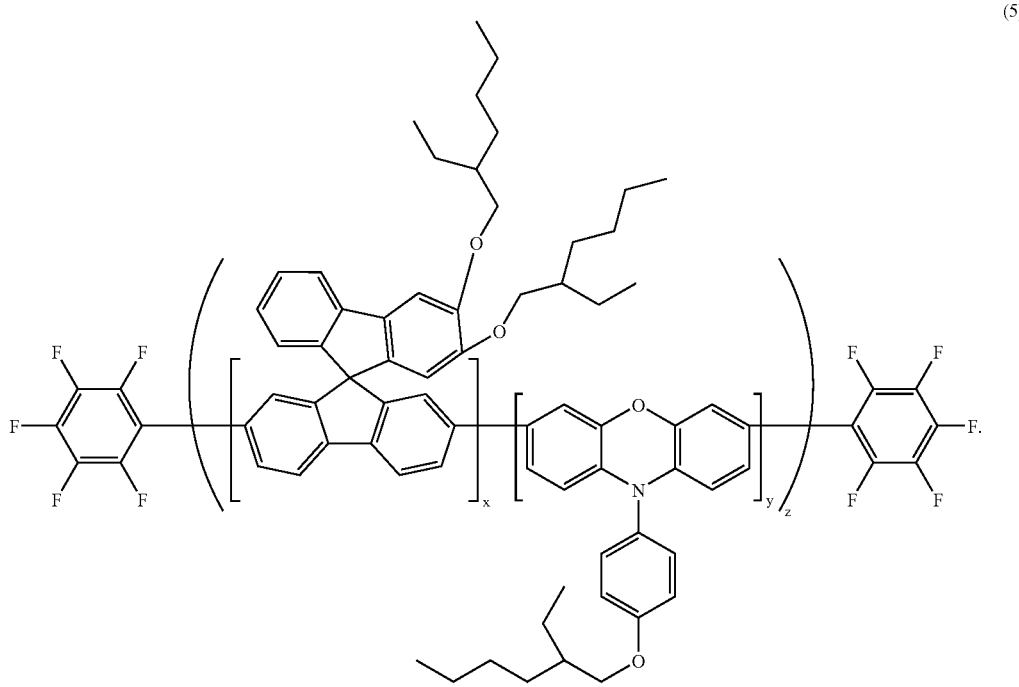

(5)

20. The organic electroluminescent device of claim 16, wherein the molecular weight distribution of the spirofluorene-based polymer ranges from 1.5 to 5.

* * * * *